United States Patent
Farkas

(10) Patent No.: US 7,939,482 B2
(45) Date of Patent: May 10, 2011

(54) CLEANING SOLUTION FOR A SEMICONDUCTOR WAFER

(75) Inventor: Janos Farkas, Saint Ismier (FR)

(73) Assignee: Freescale Semiconductor, Inc., Austin, TX (US)

( * ) Notice: Subject to any disclaimer, the term of this patent is extended or adjusted under 35 U.S.C. 154(b) by 223 days.

(21) Appl. No.: 11/914,870

(22) PCT Filed: May 25, 2005

(86) PCT No.: PCT/EP2005/006508
§ 371 (c)(1), (2), (4) Date: Nov. 19, 2007

(87) PCT Pub. No.: WO2006/125462
PCT Pub. Date: Nov. 30, 2006

(65) Prior Publication Data
US 2008/0221004 A1    Sep. 11, 2008

(51) Int. Cl.
H01L 21/306 (2006.01)
C11D 1/72 (2006.01)

(52) U.S. Cl. ......... 510/175; 134/1.3

(58) Field of Classification Search ........ 510/175; 134/1.3
See application file for complete search history.

(56) References Cited

U.S. PATENT DOCUMENTS

| | | |
|---|---|---|
| 2,917,480 A | 12/1959 | Bailey et al. |
| 3,629,310 A | 12/1971 | Bailey et al. |
| 4,080,375 A | 3/1978 | Quinlan |
| 5,114,607 A | 5/1992 | Deck et al. |
| 5,266,088 A | 11/1993 | Sandusky et al. |
| 5,340,370 A | 8/1994 | Cadien et al. |
| 5,389,194 A | 2/1995 | Rostoker et al. |
| 5,478,436 A | 12/1995 | Winebarger et al. |
| 5,527,423 A | 6/1996 | Neville et al. |
| 5,676,587 A | 10/1997 | Landers et al. |
| 5,739,579 A | 4/1998 | Chiang et al. |
| 5,770,095 A | 6/1998 | Sasaki et al. |
| 5,814,588 A | 9/1998 | Cala et al. |
| 5,836,806 A | 11/1998 | Cadien et al. |
| 5,858,813 A | 1/1999 | Scherber et al. |
| 5,893,756 A | 4/1999 | Berman et al. |
| 5,897,375 A | 4/1999 | Watts et al. |
| 5,904,159 A | 5/1999 | Kato et al. |
| 5,909,276 A | 6/1999 | Kinney et al. |
| 5,935,871 A | 8/1999 | Farkas et al. |
| 5,985,810 A | 11/1999 | Inada et al. |
| 6,001,730 A | 12/1999 | Farkas et al. |
| 6,004,188 A | 12/1999 | Roy |
| 6,069,210 A | 5/2000 | Cartridge et al. |

(Continued)

FOREIGN PATENT DOCUMENTS

JP    2002020787 A    1/2002

(Continued)

OTHER PUBLICATIONS

PCT International Search Report and Written Opinion regarding Appl. No. PCT/EP2005/006508 dated Oct. 21, 2005.

(Continued)

*Primary Examiner* — Gregory E Webb

(57) ABSTRACT

A cleaning solution for a semiconductor wafer comprises ammonia, hydrogen peroxide, a complexing agent and a block copolymer surfactant diluted in water. The cleaning solution can be used in single wafer cleaning tools to remove both particulate contaminants and metallic residues.

20 Claims, 1 Drawing Sheet

U.S. PATENT DOCUMENTS

| | | |
|---|---|---|
| 6,074,949 A | 6/2000 | Schonauer et al. |
| 6,136,714 A | 10/2000 | Schutz |
| 6,143,656 A | 11/2000 | Yang et al. |
| 6,143,705 A | 11/2000 | Kakizawa et al. |
| 6,143,706 A | 11/2000 | Morinaga |
| 6,184,141 B1 | 2/2001 | Avanzino et al. |
| 6,228,179 B1 | 5/2001 | Morinaga |
| 6,228,823 B1 | 5/2001 | Morinaga et al. |
| 6,245,662 B1 | 6/2001 | Zhao et al. |
| 6,251,787 B1 | 6/2001 | Edelstein et al. |
| 6,251,789 B1 | 6/2001 | Wilson et al. |
| 6,270,393 B1 | 8/2001 | Kubota et al. |
| 6,274,478 B1 | 8/2001 | Farkas et al. |
| 6,383,928 B1 | 5/2002 | Eissa |
| 6,443,814 B1 | 9/2002 | Miller et al. |
| 6,444,569 B2 | 9/2002 | Farkas et al. |
| 6,464,568 B2 | 10/2002 | Miller et al. |
| 6,468,910 B1 | 10/2002 | Srinivasan et al. |
| 6,491,843 B1 | 12/2002 | Srinivasan et al. |
| 6,498,132 B2 | 12/2002 | Morinaga et al. |
| 6,503,418 B2 | 1/2003 | Sahota et al. |
| 6,544,892 B2 | 4/2003 | Srinivasin et al. |
| 6,627,107 B2 | 9/2003 | Srinivasan et al. |
| 6,632,259 B2 | 10/2003 | Weinstein et al. |
| 6,660,638 B1 | 12/2003 | Wang et al. |
| 6,720,264 B2 | 4/2004 | Sahota et al. |
| 6,746,679 B2 * | 6/2004 | Nathoo .................. 424/401 |
| 6,794,285 B2 | 9/2004 | Matsui et al. |
| 6,812,193 B2 | 11/2004 | Brigham et al. |
| 6,821,881 B2 | 11/2004 | Tsai et al. |
| 6,831,048 B2 | 12/2004 | Kezuka et al. |
| 6,899,821 B2 | 5/2005 | Uchida et al. |
| 6,902,590 B2 | 6/2005 | Weinstein et al. |
| 6,936,543 B2 | 8/2005 | Schroeder et al. |
| 6,988,936 B2 | 1/2006 | Filipozzi et al. |
| 6,989,414 B2 | 1/2006 | Sata et al. |
| 7,188,630 B2 | 3/2007 | Flake et al. |
| 7,387,970 B2 | 6/2008 | Cooper et al. |
| 7,579,279 B2 | 8/2009 | Flake et al. |
| 2002/0005504 A1 | 1/2002 | Sahota et al. |
| 2002/0016073 A1 | 2/2002 | Kondo et al. |
| 2002/0016272 A1 | 2/2002 | Kakizawa et al. |
| 2002/0022582 A1 | 2/2002 | Takashima |
| 2002/0039877 A1 | 4/2002 | Svirchevski et al. |
| 2003/0051413 A1 | 3/2003 | Sakai et al. |
| 2003/0068888 A1 | 4/2003 | Kodera et al. |
| 2003/0073593 A1 | 4/2003 | Brigham et al. |
| 2003/0082912 A1 | 5/2003 | Kezuka et al. |
| 2003/0092261 A1 | 5/2003 | Kondo et al. |
| 2003/0104699 A1 | 6/2003 | Minamihaba et al. |
| 2003/0144163 A1 | 7/2003 | Morinaga et al. |
| 2003/0171456 A1 | 9/2003 | Tong et al. |
| 2004/0014319 A1 | 1/2004 | Sahota et al. |
| 2004/0038840 A1 | 2/2004 | Lee et al. |
| 2004/0077512 A1 | 4/2004 | Masahiko et al. |
| 2004/0142835 A1 * | 7/2004 | Takashima .................. 510/175 |
| 2004/0161933 A1 | 8/2004 | Takashima et al. |
| 2004/0224426 A1 | 11/2004 | Cooper et al. |
| 2004/0224521 A1 | 11/2004 | Flake et al. |
| 2005/0009322 A1 | 1/2005 | Matsui et al. |
| 2005/0054549 A1 | 3/2005 | Kezuka et al. |
| 2005/0130428 A1 | 6/2005 | Choi et al. |
| 2005/0221016 A1 | 10/2005 | Glatkowski et al. |
| 2005/0221615 A1 | 10/2005 | Toyota et al. |
| 2006/0014390 A1 | 1/2006 | Lee et al. |
| 2006/0112972 A1 * | 6/2006 | Peitersen et al. .................. 134/26 |
| 2008/0026583 A1 | 1/2008 | Hardy et al. |

FOREIGN PATENT DOCUMENTS

| | | |
|---|---|---|
| WO | 0181525 A1 | 11/2001 |
| WO | 02051955 A1 | 7/2002 |
| WO | 02051961 A2 | 7/2002 |
| WO | 02065538 A2 | 8/2002 |
| WO | 2004053045 A1 | 6/2004 |
| WO | 2005066325 A2 | 7/2005 |
| WO | 2006081406 A1 | 8/2006 |
| WO | 2008023214 A1 | 2/2008 |
| WO | 2008023215 A1 | 2/2008 |

OTHER PUBLICATIONS

International Search Report mailed May 23, 2007 for PCT/IB2006/003085 2 pages.

International Search Report mailed Apr. 13, 2007 for PCT/IB2006/003051 3 pages.

U.S. Appl. No. 12/377,810, filed Feb. 17, 2009, entitled "Rinse Formulation for Use in the Manufacture of an Integrated Circuit".

Beverina, A. et al., "Copper Photocorrosion Phenomenon during Post CMP Cleaning," Electrochemical and Solid-State Letters, 3 (3), pp. 156-158, (2000).

Sigley, Jennifer Lynn, "Use of Nonionic Surfactant to Reduce Sulfuric Acid Mist in the Copper Electrowinning Process," Arizona State University, Dec. 1999, 62 pages.

Non-Final Office Action mailed Mar. 27, 2006 for U.S. Appl. No. 10/430,987, 7 pages.

Non-Final Office Action mailed Sep. 8, 2006 for U.S. Appl. No. 10/430,987, 7 pages.

Final Office Action mailed Apr. 10, 2007 for U.S. Appl. No. 10/430,987, 7 pages.

Non-Final Office Action mailed Sep. 10, 2007 for U.S. Appl. No. 10/430,987, 6 pages.

Notice of Allowance mailed Feb. 13, 2008 for U.S. Appl. No. 10/430,987, 5 pages.

Non-Final Office Action mailed Jan. 6, 2005 for U.S. Appl. No. 10/431,053, 7 pages.

Final Office Action mailed Jul. 5, 2005 for U.S. Appl. No. 10/431,053, 7 pages.

Non-Final Office Action mailed Nov. 9, 2005 for U.S. Appl. No. 10/431,053, 8 pages.

Non-Final Office Action mailed Apr. 19, 2006 for U.S. Appl. No. 10/431,053, 9 pages.

Final Office Action mailed Sep. 27, 2006 for U.S. Appl. No. 10/431,053, 7 pages.

Notice of Allowance mailed Jan. 5, 2007 for U.S. Appl. No. 10/431,053, 6 pages.

Non-Final Office Action mailed Feb. 15, 2008 for U.S. Appl. No. 11/670,176, 9 pages.

Non-Final Office Action mailed Oct. 20, 2008 for U.S. Appl. No. 11/670,176, 7 pages.

Final Office Action mailed Apr. 17, 2009 for U.S. Appl. No. 11/670,176, 7 pages.

Notice of Allowance mailed Apr. 29, 2009 for U.S. Appl. No. 11/670,176, 4 pages.

International Search Report mailed Jan. 25, 2005 for PCT/US04/13373, 3 pages.

* cited by examiner

CLEANING SOLUTION FOR A SEMICONDUCTOR WAFER

FIELD OF THE INVENTION

This invention relates to a cleaning solution of the type, for example, that removes particulate contaminants organic and/or metallic residues from a surface of a semiconductor wafer.

BACKGROUND OF THE INVENTION

In the field of semiconductor wafer manufacturing, it is necessary for a wafer to undergo a so-called "wet clean" processing stage prior to patterning of gates. This processing stage is an important stage in the manufacture of semiconductor wafers, because cleanliness of the surface of the wafer at this early stage of manufacture impacts upon defectivity and hence yields of semiconductor devices ultimately made.

Historically, the wet clean stage comprises two cleaning step. Using a first wet bench, a first step requires wafers to undergo a so-called "RCA clean" using a Standard Clean 1 (SC-1) cleaning solution. The SC-1 cleaning solution has an alkaline pH and comprises ammonia, hydrogen peroxide and water. After the RCA clean, a second step of the wet clean stage employs a second wet bench to immerse the wafers in a Standard Clean 2 (SC-2) cleaning solution comprising hydrochloric acid, hydrogen peroxide and water, the SC-2 cleaning solution having an acid pH.

The SC-1 cleaning solution is highly efficient at removing particles and organic residuals, due to a high Zeta potential in the alkaline range of dielectric surfaces commonly forming part of a surface of a semiconductor wafer. However, the SC-1 cleaning solution is ineffective at removing metallic contamination, such as residues. The second, acidic, clean part of the wet clean stage using the SC-2 cleaning solution is therefore necessary, and use of the wet benches moreover allows batch cleaning of semiconductor wafers.

Wafer sizes are now changing and a migration to 300 mm diameter wafers is taking place. A necessary result of the migration to the 300 mm wafer size is the replacement of the above-described wet benches with single wafer processing tools to avoid cross contamination between wafers being cleaned simultaneously in a given wet bench. This change to single wafer processing tools to wet clean the wafers poses a new challenge to users of the wet clean step, since in order to maintain the throughput of wafers in the wet clean step, each individual wafer has to be cleaned in about 30 seconds as opposed to the 10 minutes taken previously when the wafers were batch cleaned. In order to facilitate the reduced process time per wafer required, it is desirable to combine the functions of the alkaline and the acidic cleaning steps.

U.S. Pat. Nos. 6,143,706, 6,228,179, 6,228,823 and 6,498,132 disclose possible cleaning solutions to reduce the cleaning time of wafers in the single wafer processing tools. The cleaning solutions disclosed operate in the alkaline range of pH to remove particulate contaminants with high efficiency. Efficiency of removal of metallic residues is addressed by employing a variety of complexing agents in the cleaning solution, the complexing agents typically containing ethylene-diamine and derivatives thereof.

Whilst the above-mentioned cleaning solutions show promise for several cleaning applications, in cleaning stages where efficiency of metal removal is critical, the above-mentioned cleaning solutions do not always provide sufficient cleaning efficiency for some applications to avoid compromising the (Charge-to-Breakdown) reliability of devices being formed.

It is, of course, known that removal of metallic species in alkaline media is difficult due to low solubility of the metallic species in the alkaline media and the high affinity of the metallic species to surface silanol groups at high pH. Removal of the metallic species is therefore driven by completing agents, though the complexing agents have to be highly efficient in order to remove the metallic species from the surface of the wafer in such a short processing time. In order to improve the efficiency of removal of the metallic species, U.S. Pat. No. 6,498,132 therefore proposes the use of multiple complexing agents.

However, even with the use of multiple complexing agents, removal of metallic species from the surfaces of wafers is still inefficient. Prior to the wet clean stage, the surface of a semiconductor wafer is hydrogen terminated, resulting in the surface of the wafer being hydrophobic. When cleaned in an alkali media, silicon on a surface of the semiconductor wafer undergoes oxidation resulting in the surface of the semiconductor wafer acquiring hydrophylic wetting properties. Consequently, the accessibility of the complexing agents to surface sites of the wafers is hindered by the inhomogeneous wet-ability of the surface of the semiconductor wafer during the oxidation of the silicon.

STATEMENT OF INVENTION

According to the present invention, there is provided a cleaning solution as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

A wafer cleaning apparatus (not shown) or tool comprises a bath in which a cleaning solution is introduced via an inlet port. Semiconductor wafers (not shown) are subsequently, and individually, immersed in the cleaning solution prior to a gate patterning stage. The cleaning process does not differ from known cleaning processes used to clean semiconductor wafers individually prior to gate patterning and so, for the sake of conciseness and simplicity of description, will not be described further herein.

The cleaning solution is made by adding ammonia, a complexing agent, hydrogen peroxide, and a block polymer surfactant to water, such that the mixture on the surface of the wafer comprises the above components in the following proportions. The mixture comprises between about 0.01 wt % and about 0.1 wt % of ammonia, between about 0.01 wt % and about 0.2 wt % of hydrogen peroxide, less than about 0.1 wt % of the complexing agent, and less than about 0.01 wt % of the block polymer surfactant. The remainder of the mixture is water; in this example, de-ionised water is employed. Of course, different ranges of proportions of components can be employed, for example. The concentration of the components can be changed and tailored to individual equipment. For example, the concentration of ammonia and hydrogen peroxide can be less than 5 wt %, the concentration of complexing agents can be less than 3 wt %, and the concentration of the block polymer surfactant can be less than 1 wt %.

The ammonia is an example of an alkaline used, but the skilled person will appreciate that other alkalines having a pH greater than 8 can be used, for example a pH greater than 9, such as a pH greater than 10.

Figure 1:
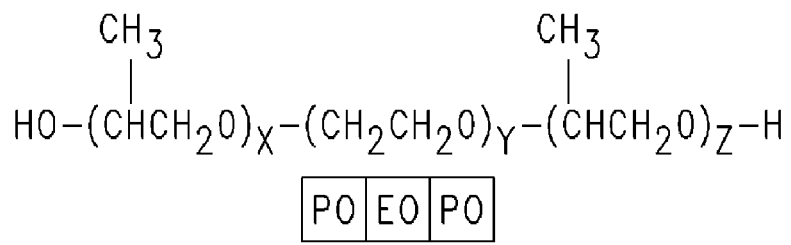
FIG. 1 is a schematic diagram of a first surfactant molecule for use in a cleaning solution constituting a first embodiment of the invention.
Figure 2:
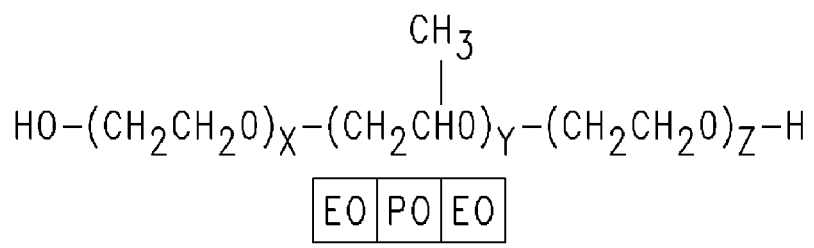
FIG. 2 is a schematic diagram of a second surfactant molecule for use in a cleaning solution constituting a second embodiment of the invention.

Referring to FIGS. 1 and 2, the block polymer is, in this example, a linear block polymer surfactants, such as a normal or reverse Pluronics® surfactant available from BASF. In this example (FIG. 1), the Pluronics surfactant used is a triblock copolymer of two hydrophobic polypropylene oxide (PO) groups or chains connected by a hydrophilic polyethylene oxide (EO) group or chain, or vice versa for the reverse type (FIG. 2). Of course, other block polymers available from different vendors, such as Clariant, can, alternatively, be used.

As already explained above, silicon on the surface of semiconductor wafers is hydrogen terminated prior to cleaning and so is hydrophobic. However, as a result of exposure to the high pH medium for removal of particulate contaminants from the surface of the semiconductor wafer, the silicon is oxidised yielding hydrophilic wetting properties. Since the PO chain of Pluronics interacts with hydrophobic surfaces, the PO chain serves as a wetting agent to allow the complexing agent to access the surface sites where metallic residues are present. Consequently, the efficiency of the reaction of the complexing agent with the metallic residues on the surface of the semiconductor wafers is improved, resulting in improved removal of the residues.

Figure 3:
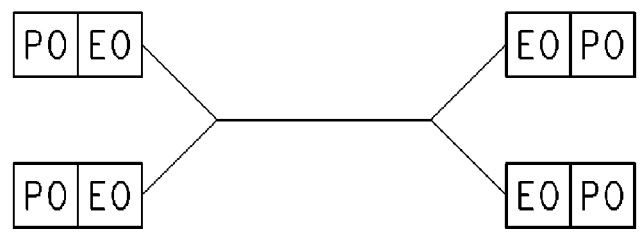
FIG. 3 is a schematic diagram of a third surfactant molecule for use in a cleaning solution constituting a third embodiment of the invention.

In another embodiment (FIG. 3), the linear block polymer surfactant is a normal and reverse Tetronic® surfactant available from BASF. Tetronics are tetrafunctional copolymers of two hydrophobic polypropylene oxide (PO) hydrophilic groups or chains connected by a polyethylene oxide (EO) group or chain.

Although particular examples of block copolymer surfactants have been described above, the skilled person will appreciate that different surfactants having different molecular weights comprising different ratios of PO to EO groups can be used to achieve different wetting properties depending upon a particular cleaning application to be carried out. Typically, the molecular weight of the surfactant is between about 1500 and about 15000 mwu, and the EO:PO ratio can be from 1:10 to 1:1.

Although the above mixtures have been described in their respective dilute forms, the skilled person will appreciate that the cleaning solutions can be provided in concentrated forms of between about 10× and about 100× concentrate for dilution in de-ionised water prior to use.

It is thus possible to provide a cleaning solution that is capable of wetting both hydrophobic and hydrophilic surfaces homogenously. Consequently, accessibility by the complexing agents to a surface of a wafer is improved. The cleaning solution therefore reacts more homogeneously with the surface of the wafer than other known cleaning solutions, resulting in improved efficiency of material removal from the surface. Since, the length and ratio of the hydrophilic and hydrophobic groups can also be modified easily, thereby enabling the surfactant to be tailored to specific chemistries for different cleaning applications. Additionally, block polymers do not result in the formation of micelles and so are not sensitive to precipitation.

The invention claimed is:

1. A cleaning solution for removal of particulate contaminants and metallic residues from a surface of a semiconductor wafer, the solution comprising:
   an alkali;
   hydrogen peroxide;
   water;
   a complexing agent; and
   a surfactant in an amount of less than 1 wt %; wherein the surfactant is a triblock copolymer type surfactant having at least one hydrophilic copolymer block and at least one hydrophobic copolymer block.

2. A solution as claimed in claim 1, wherein the hydrophobic copolymer block includes a polypropylene oxide group and the hydrophilic copolymer block includes a polyethylene oxide group.

3. A solution as claimed in claim 2 wherein the ratio of the polyethylene oxide groups to the polypropylene oxide groups is between 1:10 to 1:1.

4. A solution as claimed in claim 1 wherein the block copolymer
   type surfactant has a molecular weight of between about 1500 and about 15000 mwu.

5. A solution as claimed in claim 1 wherein the solution comprises between about 0.01 wt % and about 5 wt % of the alkali.

6. A solution as claimed in claim 1 wherein the solution comprises between about 0.01 wt % and about 5 wt % of hydrogen peroxide.

7. A solution as claimed in claim 1 wherein the solution comprises less than about 3 wt % of the complexing agent.

8. A method comprising:
   cleaning using a cleaning solution, the cleaning solution including:
      an alkali;
      hydrogen peroxide;
      water;
      a complexing agent; and
      a surfactant in an amount less than 1 wt %; wherein the surfactant is a triblock copolymer type surfactant having at least one hydrophilic copolymer block and at least one hydrophobic copolymer block.

9. A method comprising:
   cleaning a semiconductor wafer using a cleaning solution, the cleaning solution including:
      an alkali;
      hydrogen peroxide;
      water;
      a complexing agent; and
      a surfactant; wherein the surfactant is a triblock copolymer type surfactant having at least one hydrophilic copolymer block at least one hydrophobic copolymer block.

10. A method as claimed in claim 9, wherein the hydrophobic copolymer block includes a polypropylene oxide group and the hydrophilic copolymer block includes a polyethylene oxide group.

11. A method as claimed in claim 10 wherein the ratio of the polyethylene oxide groups to the polypropylene oxide groups is between 1:10 to 1:1.

12. A method as claimed in claim 9 wherein the surfactant is the triblock copolymer having two of the at least one hydrophobic copolymer blocks connected by the at least one hydrophilic copolymer block.

13. A method as claimed in claim 9 wherein the surfactant is the triblock copolymer having two polypropylene oxide copolymer blocks connected by a polyethylene oxide copolymer block.

14. A method as claimed in claim 9 wherein the cleaning solution includes less than 1 wt % of the surfactant.

15. A method as claimed in claim 9 further comprising patterning gates, wherein cleaning the semiconductor wafer is performed prior to patterning gates.

16. A cleaning solution as claimed in claim 1 wherein the alkali includes ammonium hydroxide.

17. A cleaning solution as claimed in claim 6 wherein the solution comprises between about 0.01 wt % and about 0.2 wt % of the hydrogen peroxide.

18. A cleaning solution as claimed in claim 1 wherein the solution has a pH of at least 8.

19. A cleaning solution as claimed in claim 18 wherein the solution has a pH of at least 9.

20. A cleaning solution as claimed in claim 1 wherein the triblock copolymer includes two polypropylene oxide copolymer blocks connected by a polyethylene oxide copolymer block.

* * * * *